(12) United States Patent
Shim et al.

(10) Patent No.: US 10,338,418 B2
(45) Date of Patent: Jul. 2, 2019

(54) LIGHT EMITTING MODULE AND DISPLAY DEVICE INCLUDING THE SAME

(71) Applicant: Samsung Display Co., Ltd., Yongin-si, Gyeonggi-do (KR)

(72) Inventors: Kyu-Hun Shim, Seoul (KR); Jae Sul An, Hwaseong-si (KR); Ju Hwa Ha, Jung-gu (KR)

(73) Assignee: Samsung Display Co., Ltd. (KR)

( * ) Notice: Subject to any disclaimer, the term of this patent is extended or adjusted under 35 U.S.C. 154(b) by 6 days.

(21) Appl. No.: 15/650,571

(22) Filed: Jul. 14, 2017

(65) Prior Publication Data

US 2018/0039108 A1 Feb. 8, 2018

(30) Foreign Application Priority Data

Aug. 2, 2016 (KR) .................. 10-2016-0098417

(51) Int. Cl.
| | |
|---|---|
| *F21V 8/00* | (2006.01) |
| *G02B 6/00* | (2006.01) |
| *G02F 1/03* | (2006.01) |
| *G02F 1/13* | (2006.01) |
| *H01L 27/15* | (2006.01) |
| *H01L 51/50* | (2006.01) |

(52) U.S. Cl.
CPC ............ *G02F 1/1323* (2013.01); *G02B 6/00* (2013.01); *G02B 6/002* (2013.01); *G02B 6/0068* (2013.01); *G02B 6/0091* (2013.01); *H01L 27/153* (2013.01); *H01L 51/5012* (2013.01); *G02B 6/0001* (2013.01); *G02F 1/0338* (2013.01)

(58) Field of Classification Search
CPC ......... G02F 1/1323; G02B 6/00; G02B 6/002; G02B 6/0068; G02B 6/0091; H01L 27/153; H01L 51/5012
USPC ....................................................... 362/618
See application file for complete search history.

(56) References Cited

U.S. PATENT DOCUMENTS

| | | | |
|---|---|---|---|
| 2002/0044436 A1* | 4/2002 | Ohkawa ............... | G02B 6/0036 362/621 |
| 2003/0090888 A1* | 5/2003 | Mizutani .............. | G02B 6/0028 362/611 |

(Continued)

FOREIGN PATENT DOCUMENTS

| KR | 10-2007-0056376 A | 6/2007 |
|---|---|---|
| KR | 10-2008-0111590 A | 12/2008 |

(Continued)

*Primary Examiner* — Bryon T Gyllstrom
(74) *Attorney, Agent, or Firm* — Innovation Counsel LLP (57) ABSTRACT

A light emission module includes: a light guide including emission sides disposed facing each other, a first and second side connecting the emission sides, a third side connecting the first and second side; a light source unit including a first and second light source corresponding to the first and third side respectively, and a light source substrate supporting the first and second light source and including a first and second portion supporting the first and second light source respectively, the second portion inclined at a first angle with respect to the first portion, the second light source emits a light incident on the third side comprising a first and second orientation angle edge light, the former inclined at a second angle and refracted to propagate in a path adjacent to the second side, and then refracted adjacent to the second side, the first angle smaller than the third angle.

12 Claims, 9 Drawing Sheets

(56) References Cited

U.S. PATENT DOCUMENTS

| | | | | |
|---|---|---|---|---|
| 2003/0231483 A1* | 12/2003 | Higashiyama | ....... | G02B 6/0038 362/610 |
| 2004/0130879 A1* | 7/2004 | Choi | .................... | G02B 6/0038 362/617 |
| 2007/0103936 A1* | 5/2007 | Yue | ...................... | G02B 6/0016 362/613 |
| 2008/0316767 A1* | 12/2008 | Woo | ........................ | G02B 6/002 362/612 |
| 2010/0290246 A1* | 11/2010 | Kim | ........................ | G02B 6/002 362/602 |
| 2012/0057367 A1* | 3/2012 | Park | .................. | G02F 1/133603 362/606 |
| 2012/0170309 A1* | 7/2012 | Kim | ...................... | G02B 6/0081 362/606 |
| 2012/0300494 A1* | 11/2012 | Watabe | .................. | G02B 26/02 362/602 |
| 2013/0039093 A1* | 2/2013 | Song | ...................... | G02B 6/002 362/613 |
| 2013/0044508 A1* | 2/2013 | Bae | .................. | G02F 1/133615 362/602 |
| 2017/0319726 A1* | 11/2017 | Kim | ........................ | A61L 2/10 |

FOREIGN PATENT DOCUMENTS

| | | |
|---|---|---|
| KR | 10-2012-0064524 A | 6/2012 |
| KR | 10-2014-0078224 A | 6/2014 |

\* cited by examiner

LIGHT EMITTING MODULE AND DISPLAY DEVICE INCLUDING THE SAME

CROSS-REFERENCE TO RELATED APPLICATION

This application claims priority to and the benefit of Korean Patent Application No. 10-2016-0098417 filed in the Korean Intellectual Property Office on Aug. 2, 2016, the entire contents of which are incorporated herein by reference.

BACKGROUND (a) Technical Field

The present inventive concept relates to a light emission module and a display device including the same.

(b) Description of the Related Art

A liquid crystal display (LCD) is one of the most widely used display devices. The liquid crystal display applies an electric field to a liquid crystal display panel that includes a liquid crystal layer to change an alignment of liquid crystal molecules. Using this, the transmittance of light is regulated to thereby display images. The liquid crystal panel is non-emissive, and therefore the liquid crystal display includes a backlight unit for providing light to the liquid crystal panel from a rear side of the liquid crystal panel.

As a light source included in the backlight unit, a cold cathode fluorescent lamp (CCFL) has been used in a conventional art. However, recently, a light emitting diode (LED) has been widely used because it consumes less power compared to the CCFL while having excellent color reproducibility and a long life-span.

Depending on a location of such a light source, a darkened area may be formed in a light guide of the backlight unit.

The above information disclosed in this Background section is only for enhancement of understanding of the background of the invention and therefore it may contain information that does not form the prior art that is already known in this country to a person of ordinary skill in the art.

SUMMARY

Exemplary embodiments of the present inventive concept have been made in an effort to provide a light emission module that can minimize a darkened area, and a display device including the same.

A light emission module according to an exemplary embodiment of the present inventive concept includes: a light guide including a pair of emission sides that are disposed facing each other, a first side connecting each of the pair of emission sides and extending in a first direction, a second side connecting each of the pair of emission sides and extending in a second direction that is different from the first direction, and a third side that connects the first side and the second side; and a light source unit provided at one side of the light guide and distanced from the light guide, wherein the light source unit includes a first light source that corresponds to the first side, a second light source that corresponds to the third side, and a light source substrate that supports the first light source and the second light source, the light source substrate includes a first portion that supports the first light source and a second portion that supports the second light source, the second portion is inclined at a first angle with respect to the first portion, the second light source is configured to emit a light incident on the third side, the light comprising a first orientation angle edge light and a second orientation angle edge light, the first orientation angle edge light inclined at a second angle and refracted to propagate in a path adjacent to the second side, and the first angle is smaller than the third angle.

The third side may be inclined with respect to the first side and the second side.

The second orientation angle edge light may be incident on the third side and refracted to propagate in a path adjacent to the first side.

An angle between the first orientation angle edge light and the second orientation angle edge light may be an orientation angle of the second light source.

The second angle may equal half of the orientation angle, and when the first angle is α and the orientation angle is β, the following equation may be satisfied:

$$\alpha < \sin^{-1}\left[\sin\left(\frac{\beta}{2}\right) \times \left(\frac{n1}{n2}\right)\right]$$

where n1 denotes a refractive index of an air layer between the second light source and the light guide and n2 is a refractive index of the light guide.

A display device according to an exemplary embodiment of the present inventive concept includes: a display panel displaying an image; and a light emission module supplying light to the display panel, wherein the light emission module includes: a light guide including a pair of emission sides that are disposed facing each other, a first side connecting each of the pair of emission sides and extending in a first direction, a second side connecting each of the pair of emission sides and extending in a second direction that is different from the first direction, and a third side that connects the first side and the second side; and a light source unit provided at one side of the light guide and distanced from the light guide, wherein the light source unit includes a first light source that corresponds to the first side, a second light source that corresponds to the third side, and a light source substrate that supports the first light source and the second light source, the light source substrate includes a first portion that supports the first light source and a second portion that supports the second light source, the second portion is inclined at a first angle with respect to the first portion, the second light source is configured to emit a light incident on the third side, the light comprising a first orientation angle edge light and a second orientation angle edge light, the first orientation angle edge light inclined at a second angle and refracted to propagate in a path adjacent to the second side, and the first angle is smaller than the third angle.

The display panel may include a display area where an image is displayed and a peripheral area that surrounds the display area, the display panel and the display area may each include a pair of first sides extending in the first direction, a pair of second sides extending in the second direction, and each of the connection portions connecting the first sides and the second sides that neighbor each other, and each of the connection portions may be rounded.

The display panel may include a display area where an image is displayed and a peripheral area that surrounds the display area, the display panel and the display area may each include a pair of first sides extending in the first direction, a pair of second sides extending in the second direction, and connection portions connecting the first sides and the second sides that neighbor each other, and each of the connection portions may be inclined with respect to the first sides and the second sides that neighbor each other.

According to the exemplary embodiments of the present inventive concept, a darkened area of the light emission module can be minimized.

DETAILED DESCRIPTION OF THE EMBODIMENTS

The present inventive concept will be described more fully hereinafter with reference to the accompanying drawings, in which exemplary embodiments of the invention are shown. As those skilled in the art would realize, the described embodiments may be modified in various different ways, all without departing from the spirit or scope of the present inventive concept.

Accordingly, the drawings and description are to be regarded as illustrative in nature and not restrictive. Like reference numerals designate like elements throughout the specification.

The size and thickness of each configuration shown in the drawings are arbitrarily shown for better understanding and ease of description, but the present inventive concept is not limited thereto. In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" means positioning on or below the object portion, but does not essentially mean positioning on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in this specification, the phrase "on a plane" means viewing a target portion from the top, and the phrase "on a cross-section" means viewing a cross-section formed by vertically cutting a target portion from the side.

Figure 1:
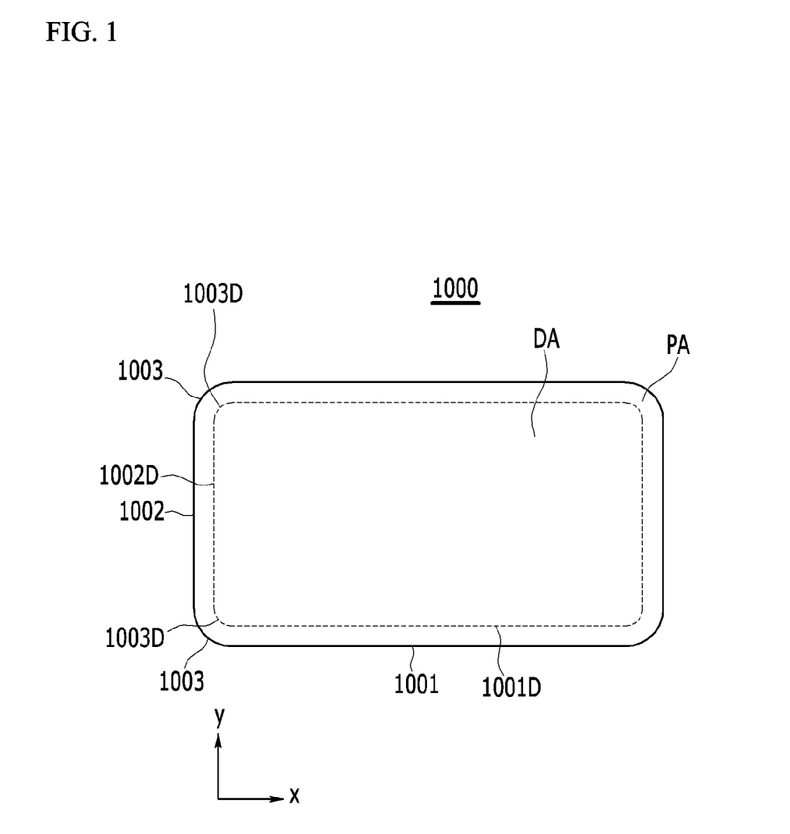
FIG. 1 is a schematic view of a display device according to an exemplary embodiment of the present inventive concept.

FIG. 1 schematically illustrates a display device according to an exemplary embodiment of the present inventive concept.

Referring to FIG. 1, a display device 1000 viewed from the front is schematically illustrated. The display device 1000 includes a pair of first sides 1001 extending in a first direction, which is the x-axis direction, a pair of second sides 1002 extending in a second direction, which is the y-axis direction, and a connection portion 1003 that connects the first side 1001 and the second side 1002. A length of the first side 1001 is longer than a length of the second side 1002, and the connection portion 1003 connects a first side 1001 and a second side 1002 that neighbor each other. Corners of the connection portion 1003 are rounded.

The display device 1000 includes a display area DA where an image is displayed and a peripheral area PA that surrounds the display area DA. The display area DA occupies most of the entire area of the display device 1000. The peripheral area PA is an area where no image is displayed, and therefore is called a non-display area or a bezel.

The shape of the display area DA is similar to the shape of the display device 1000. Specifically, the display area DA includes a pair of first sides 1001D extending in a first direction, a pair of second sides 1002D extending in a second direction, and a connection portion 1003D connecting the first side 1001D and a second side 1002D. A length of the first side 1001D is longer than a length of the second side 1002D, and the connection portion 1003D connects a first side 1001D and a second side 1002D that neighbor each other. Corners of the connection portion 1003D are rounded.

Figure 2:
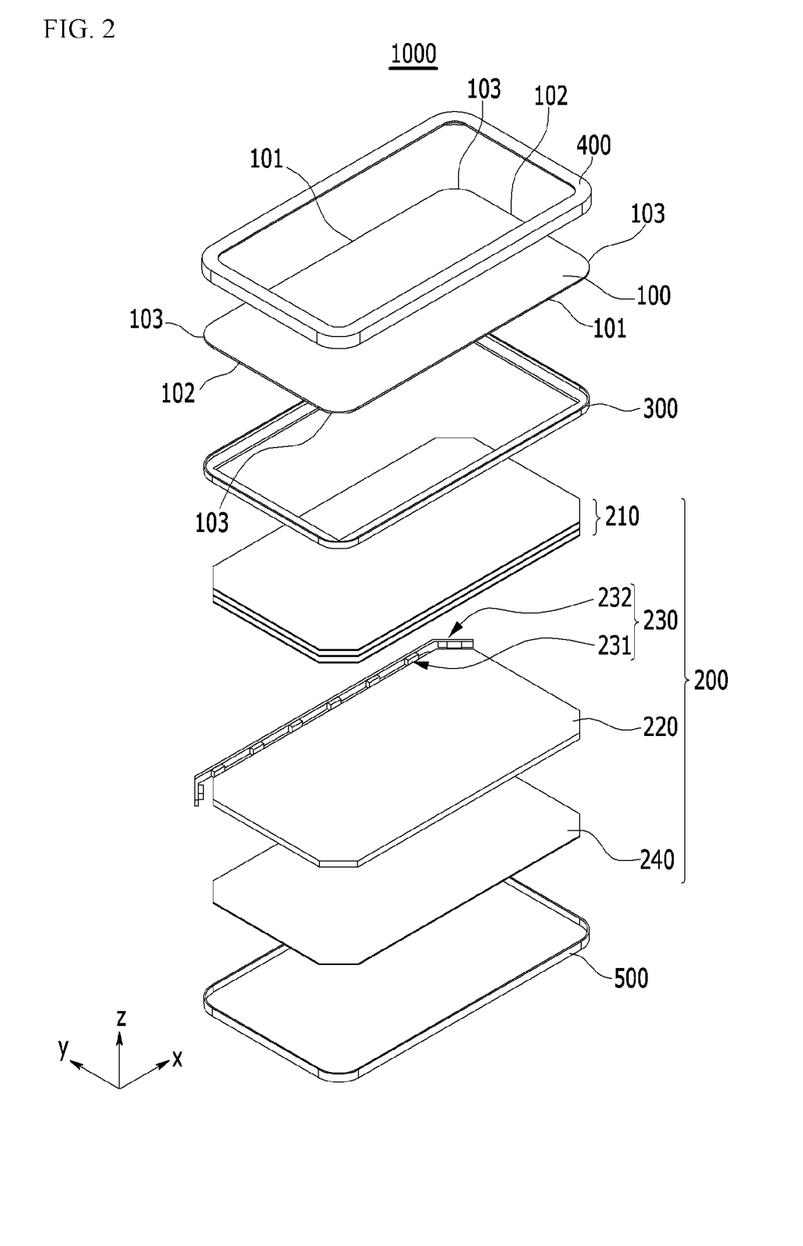
FIG. 2 schematically illustrates an exemplary exploded perspective view of the display device of FIG. 1.

Referring to FIG. 2, constituent elements of the display device according to the present exemplary embodiment will be described in detail.

FIG. 2 schematically illustrates an exploded perspective view of the display device of FIG. 1.

Referring to FIG. 2, the display device 1000 according to the present exemplary embodiment includes a display panel 100 where an image is displayed by receiving light, and a light emission module 200 that supplies light to the display panel 100. In addition, the display device 1000 includes a frame 300 that supports the light emission module 200 and the display panel 100, a top chassis 400, and a bottom chassis 500. Here, the display panel 100 includes the above-stated display area DA and peripheral area PA (refer to FIG. 1).

In addition, the display device 1000 may be provided with a protection window (not shown) for protection of the display panel 100 from external impact and foreign particles.

The shape of the display panel 100 is similar to the shape of the display device 1000. Specifically, the display panel 100 includes a pair of first sides 101 extending in the first direction, a pair of second sides 102 extending in the second direction, and a connection portion 103 connecting the first side 101 and the second side 102. A length of the first side 101 is longer than a length of the second side 102, and the connection portion 103 connects a first side 101 and a second side 102 that neighbor each other. Corners of the connection portion 103 are rounded.

The display panel 100 may include two thin substrates made of an insulation material such as glass or plastic and the like, and a liquid crystal layer provided between the two substrates. A thin film layer such as a plurality of thin film transistors, a plurality of data lines, a plurality of gate lines, a plurality of pixel electrodes, and the like may be provided in one of the two substrates. A thin film layer such as a color filter that represents a predetermined color from light that passes therethrough, a common electrode, and the like may be provided in the other substrate. However, this is not restrictive, and the color filter and the common electrode may be provided in the substrate where the thin film transistor is provided.

Alternatively, the display panel 100 may include a single thin substrate made of an insulation material such as transparent glass or plastic and the like, and a liquid crystal layer disposed on the substrate. A thin film layer such as a plurality of thin film transistors, a plurality of data lines, a plurality of gate lines, a plurality of pixel electrodes, a common electrode, a color filter, and the like may be provided in the substrate, and the liquid crystal layer may be provided in a minute space that is disposed between a pixel electrode and a common electrode to which a common voltage is applied.

An integrated circuit chip on film (not shown) and a flexible printed circuit board that apply a driving signal to the display panel 100 may be attached to the display panel 100.

The light emission module 200 is disposed below the display panel 100. Corners of the light emission module 200 are obliquely formed such that the entire shape of the light emission module 200 is an octagon.

The light emission module 200 includes an optical sheet 210, a light guide 220, a light source unit 230, and a reflection sheet 240.

The light source unit 230 includes a light source 231 emitting light and a light source substrate 232 supplying power to the light source 231 and supporting the light source 231.

The light guide 220 guides light emitted from the light source 231 to the display panel 100. The light source unit 230 is provide at or next to one side of the light guide 220 and emits light to the light guide 220.

The optical sheet 210 is provided above the light guide 220, and supplies light to the display panel 100 by assuring a luminance characteristic of light.

The reflection sheet is provided below the light guide 220 and reflects light emitted from the light guide 220.

The shapes of the frame 300, the top chassis 400, and the bottom chassis 500 are similar to the shape of the display panel 100 on a plane view.

The frame 300 has an open top side and an open bottom side, and surrounds the light emission module 200. The frame 300 supports the display panel 100.

The bottom chassis 500 receives the frame 300 and the light emission module 200, and the top chassis 400 protects and supports the display panel 100.

The top chassis 400, the display panel 100, the frame 300, the light emission module 200, and the bottom chassis 500 are assembled such that the display device 1000 is formed.

Next, a light source unit and the light guide of the display device according to the present exemplary embodiment will be described with reference to FIG. 3 to FIG. 5.

Figure 3:
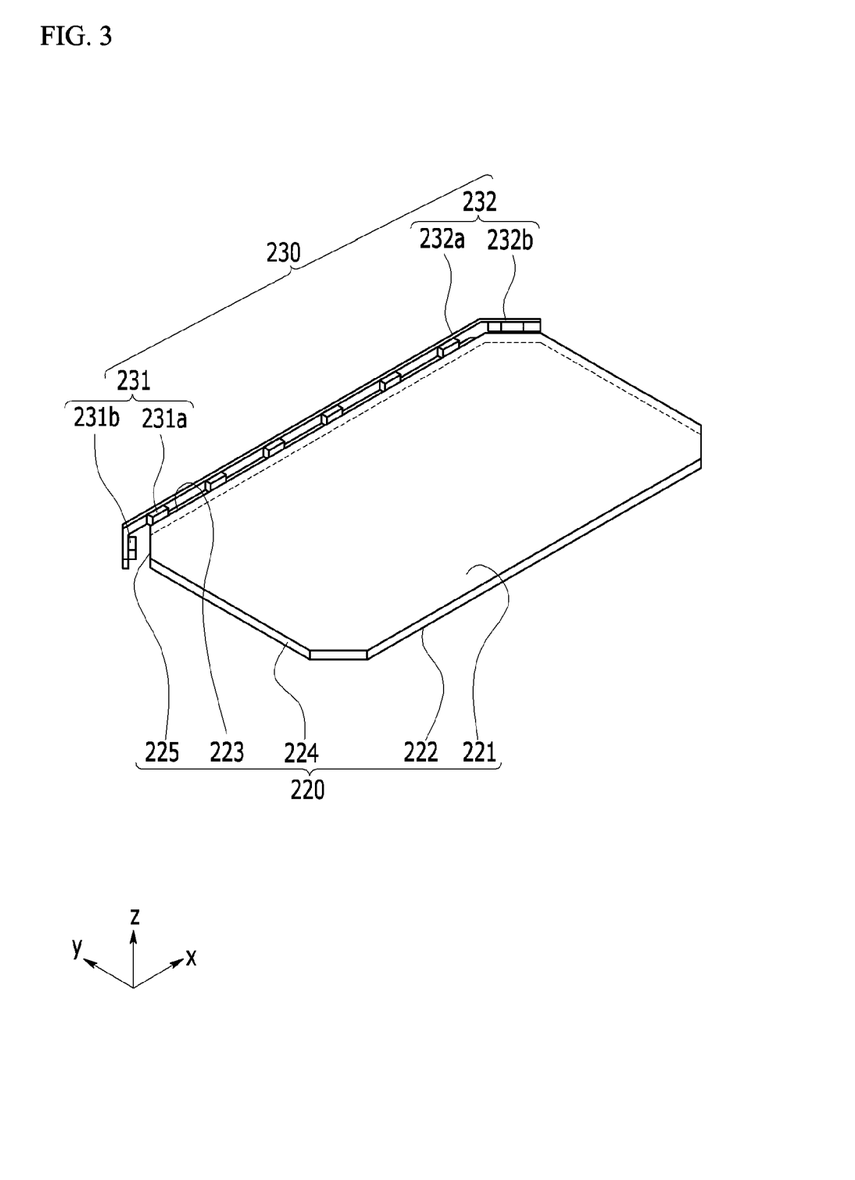
FIG. 3 exemplarily illustrates a light source unit and a light guide of the display device of FIG. 1.

FIG. 3 schematically illustrates the light source unit and the guide light of the display device of FIG. 1. FIG. 4 and FIG. 5 schematically illustrate light emission of the light source unit of the display device of FIG. 1.

Figure 4:
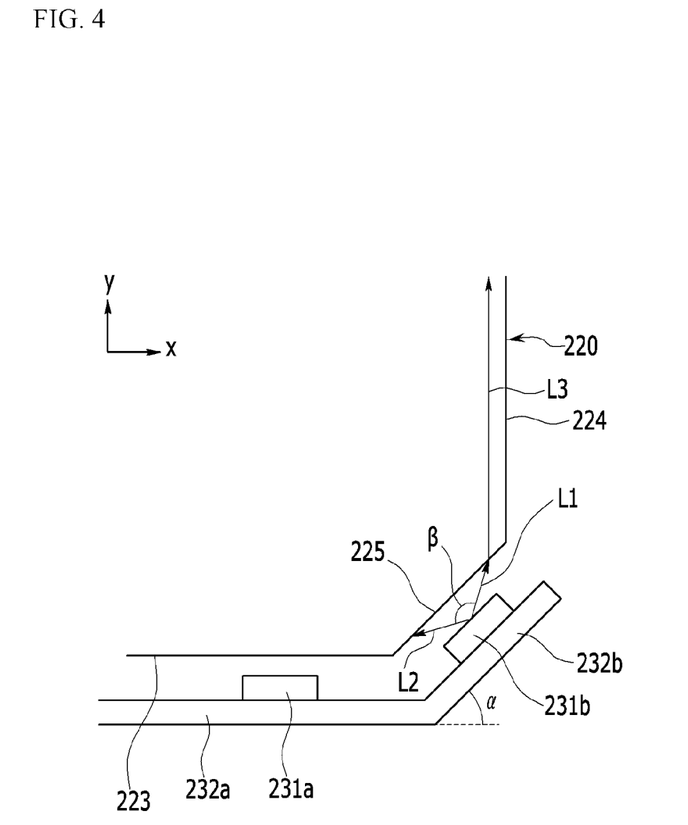
FIG. 4 and FIG. 5 schematically illustrate light emission from the light source unit of the display device of FIG. 1.
Figure 5:
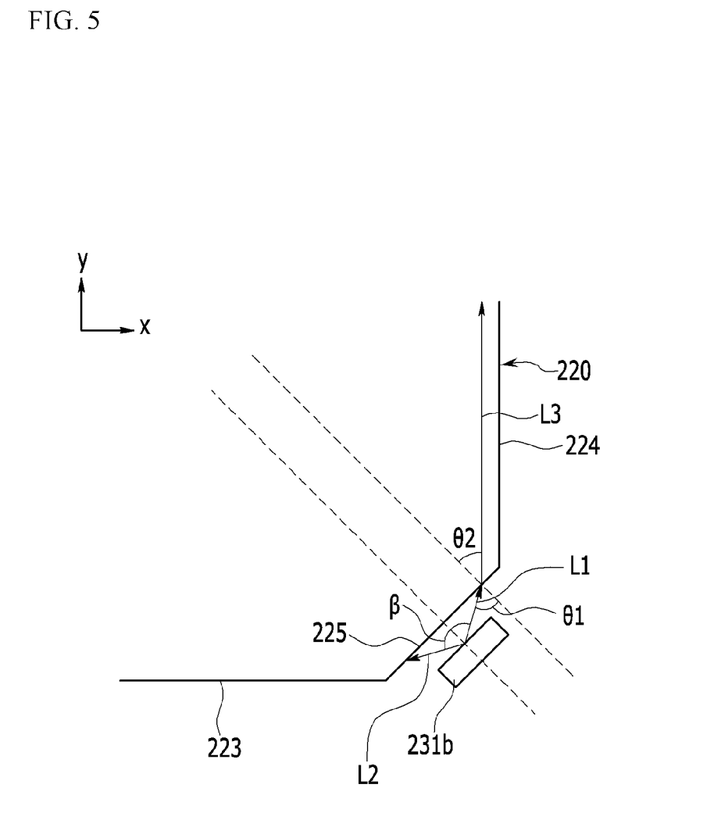

Referring to FIG. 3 to FIG. 5, the light guide 220 includes a first emission side 221 and a second emission side 222 emitting light emitted from the light source unit 230. Light from the first emission side 221 is emitted to the display panel 100, and light from the second emission side 222 is emitted to the reflection sheet 240. The first emission side 221 and the second emission side 222 are disposed facing each other.

In addition, the light guide 220 includes a first side 223, a second side 224, and a third side 225 that connect the first emission side 221 and the second emission side 222. The first side 223 extends in a first direction (i.e., x-axis direction), and the second side 224 extends in a second direction (i.e., y-axis direction) that is substantially perpendicular to the first direction. The third side 225 connects the first side 223 and the second side 224 with each other. A length of the first side 223 may be longer than a length of the second side 224. The third side 225 is inclined with respect to the first side 223 and the third side 224.

The light source unit 230 is distanced from the light guide 220 and is disposed in one side of the light guide 220, and includes the light source 231 and the light source substrate 232.

The light source 231 emits light, and includes a first light source 231*a* that corresponds to the first side 223 of the light guide 220 and a second light source 231*b* that corresponds to the third side 225 of the light guide 220. The first light source 231*a* may be provided in plural. The first light source 231*a* and the second light source 231*b* may include light emitting diodes (LEDs).

The light source substrate 232 supplies power to the light source 231 and supports the light source 231. Such a light source substrate 232 includes a first portion 232*a* that supports the first light source 231*a* and a second portion 232*b* that supports the second light source 231*b*. The second portion 232*b* is disposed at opposite sides of the first portion 232*a*. Thus, the second light sources 231*b* are disposed at opposite ends of the light source substrate 232.

Light emitted from the second light source 231*b* includes a first orientation angle edge light L1 and a second orientation angle edge light L2. The first orientation angle edge light L1 is incident on the third side 225 of the light guide 220 and is then refracted propagate in a path adjacent to the second side 224. The second orientation angle edge light L2 is incident on the third side 225 of the light guide 220 and is then refracted propagate in a path adjacent to the first side 223.

An angle between the first orientation angle edge light L1 and the second orientation angle edge light L2 becomes an orientation angle β between light emitted from the second light source 231*b*.

The first portion 232*a* of the light source substrate 232 is disposed in parallel with the first side 223 of the light guide 220. The second portion 232*b* of the light source substrate 232 is extended from the first portion 232*a*, and is inclined at a first angle α with respect to the first portion 232*a*. Angle α can also be defined as the angle between second portion 232*b* and the direction of extension of first portion 232*a*. That is, the second light source 231*b* supported by the second portion 232*b* of the light source substrate 232 is inclined at the first angle α with respect to the first portion 232*a* of the light source substrate 232.

As shown in FIG. 5, the first orientation angle edge light L1 is inclined at a second angle θ1—with respect to the normal of third side 225—and is then incident on the third side 225 of the light guide 220. The first orientation angle edge light L1 incident on the third side 225 of the light guide 220 is refracted at a third angle of θ2 and thus becomes refracted light L3. That is, the first orientation angle edge light L1 is incident on the third side 225 of the light guide 220 and is then refracted such that the refracted light L3 is formed, and the second angle θ1 becomes an incident angle of the first orientation angle edge light L1 and the third angle θ2 becomes a refracted angle of the first orientation angle edge light L1.

In the present exemplary embodiment, the first angle α is set to be smaller than the third angle θ2. Thus, light emitted from the second light source 231b may propagate in a path adjacent to the second side 224 of the light guide 220.

Meanwhile, the second angle θ1, which is an incident angle of the first orientation angle edge light L1, and the third angle θ2, which is a refracted angle of the first orientation angle edge light L1, satisfy the following Equation 1 by Snell's law.

$$\frac{\sin\theta1}{\sin\theta2} = \frac{n1}{n2} \quad \text{Equation 1}$$

Here, n1 denotes a refractive index of an air layer between the second light source 231b and the light guide 220, and n2 denotes a refractive index of the light guide 220.

The second angle θ1 equals half of the orientation angle β of the light emitted from the second light source 231b.

Thus, the first angle α satisfies the following Equation 2.

$$\alpha < \sin^{-1}\left[\sin\left(\frac{\beta}{2}\right) \times \left(\frac{n1}{n2}\right)\right] \quad \text{Equation 2}$$

As described, an angle at which the second portion 232b of the light source substrate 232 is inclined with respect to the second portion 232b of the light source substrate 232, that is, the first angle α, is set to be smaller than the third angle θ2, which is the refracted angle of the second orientation angle edge line L2, such that the light emitted from the second light source 231b can propagate in a path adjacent to the second side 224 of the light guide 220.

Accordingly, in the display device 1000 that includes the display area DA having rounded edges, the second light source 231b is set to be inclined at the first angle α with respect to the first portion 232a of the light source substrate 232 such that a darkened area of the light guide 220 can be minimized.

In addition, since the darkened area of the light guide 220 is minimized, the light emitted from the light source 231 can be uniformly supplied to the display panel 100.

Hereinafter, a display device according to another exemplary embodiment of the present inventive concept will be described with reference to FIG. 6 and FIG. 7.

Figure 6:
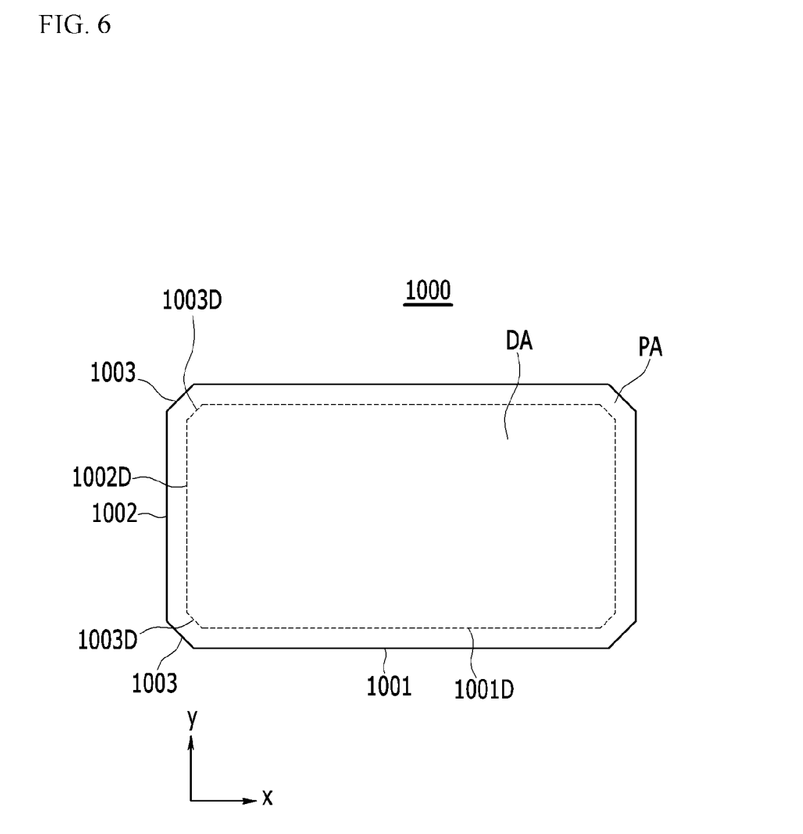
FIG. 6 schematically illustrates a display device according to another exemplary embodiment of the present inventive concept.

FIG. 6 schematically illustrates a display device according to another exemplary embodiment of the present inventive concept. FIG. 7 is a schematic exploded perspective view of the display device of FIG. 6.

Figure 7:
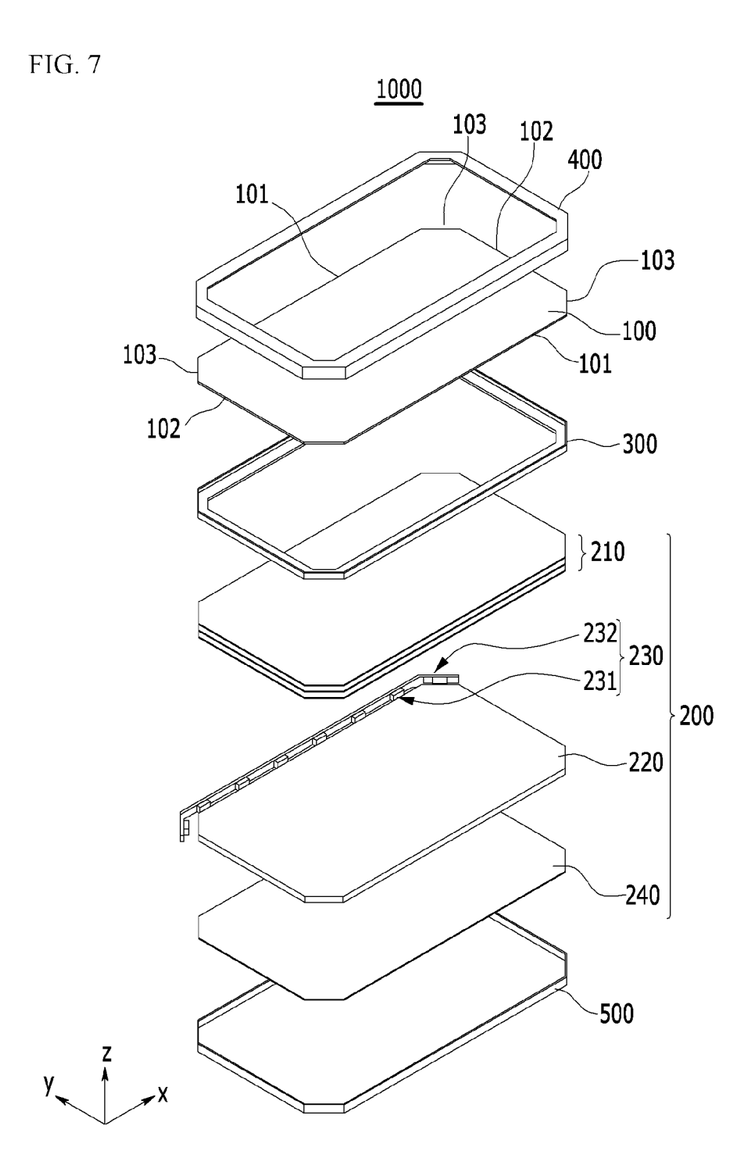
FIG. 7 exemplarily illustrates an exploded perspective view of the display device of FIG. 6.

Referring to FIG. 6 and FIG. 7, a display device 1000 according to the present exemplary embodiment is the same as the display device of FIG. 1 except for the shapes of corners of a display device, a display panel, a frame, a top chassis, and a bottom chassis. Accordingly, a description for the same structure will be omitted.

Referring to FIG. 6, the display device 1000 viewed from the front is schematically illustrated. The display device 1000 includes a pair of first sides 1001, a pair of second sides 1002, and a connection portion 1003 that connects the first side 1001 and the second side 1002. A length of the first side 1001 is longer than a length of the second side 1002, and the connection portion 1003 connects neighboring first and second sides 1001 and 1002. The connection portion 1003 is inclined with respect to the first side 1001 and the second side 1002.

Referring to FIG. 7, the shape of a display panel 100 is similar to the shape of the display device 1000. Specifically, the display panel 100 includes a pair of first sides 101 extending in a first direction, a pair of second sides 102 extending in a second direction, and a connection portion 103 connecting the first side 101 and the second side 102. A length of the first side 101 is longer than a length of the second side 102, and the connection portion 103 connects a first side 101 and a second side 102 that neighbor each other. The connection portion 103 is inclined with respect to the first side 101 and the second side.

The shapes on the plane view of a frame 300, a top chassis 400, and a bottom chassis 500 are similar to the shape of the display panel 100.

Hereinafter, a display device according to another exemplary embodiment of the present inventive concept will be described with reference to FIG. 8 and FIG. 9.

Figure 8:
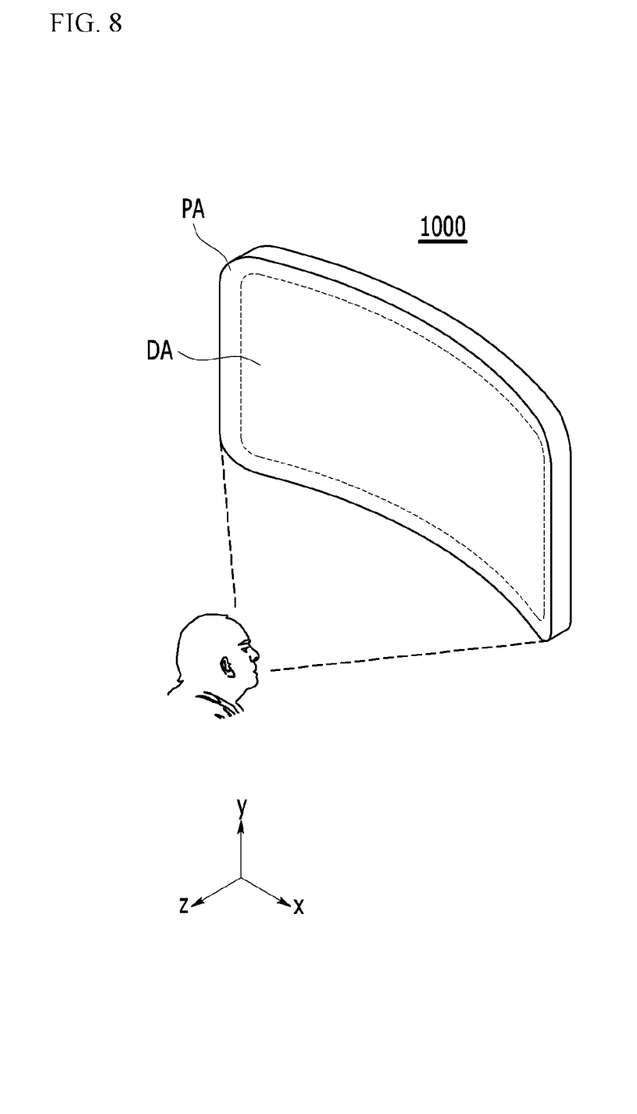
FIG. 8 schematically illustrates a display device according to another exemplary embodiment of the present inventive concept.

FIG. 8 schematically illustrates a display device according to another exemplary embodiment of the present inventive concept.

Referring to FIG. 8, a display device 1000 according to the present exemplary embodiment may be a curved display device that is curved along the x-axis direction, which is a long axis direction. Other structures are the same as those of the display device of FIG. 1, and therefore no further description will be provided.

Figure 9:
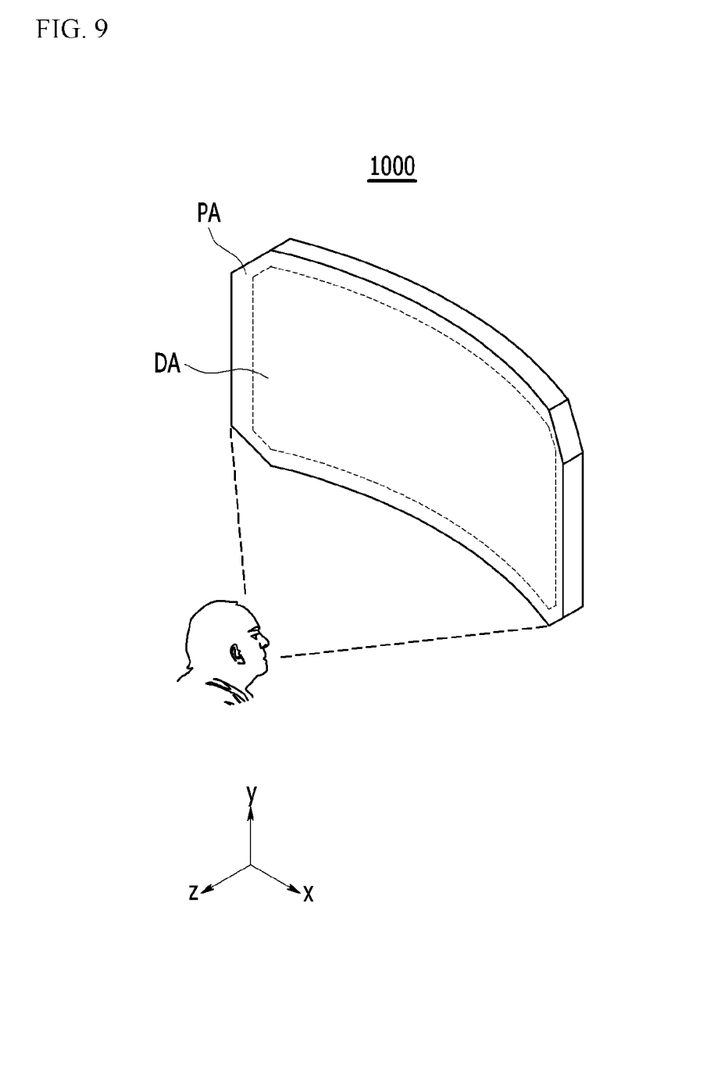
FIG. 9 schematically illustrates a display device according to another exemplary embodiment of the present inventive concept.

FIG. 9 schematically illustrates a display device according to another exemplary embodiment of the present inventive concept.

Referring to FIG. 9, a display device 1000 according to the present exemplary embodiment may be a curved display device that is curved along the x-axis direction, which is a long axis direction. Other structures are the same as those of the display device of FIG. 6, and therefore no further description will be provided.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

100: display panel
200: emission module
210: optical sheet
220: light guide
230: light source unit
231: light source
232: light source substrate
240: reflection sheet
300: frame
400: top chassis
500: bottom chassis

What is claimed is:
1. A light emission module comprising:
a light guide including a pair of emission sides that are disposed facing each other, a first side connecting each of the pair of emission sides and extending in a first direction, a second side connecting each of the pair of emission sides and extending in a second direction that is different from the first direction, and a third side that connects the first side and the second side; and a light source unit provided at one side of the light guide and distanced from the light guide, wherein the light source unit comprises a first light source that corresponds to the first side, a second light source that corresponds to the third side, and a light source substrate that supports the first light source and the second light source, the light source substrate comprises a first portion that supports the first light source and a second portion that supports the second light source, the second portion is inclined at a first angle with respect to the first portion, the second light source is configured to emit a light incident on the third side, the light comprising a first orientation angle edge light and a second orientation angle edge light, the first orientation angle edge light inclined at a second angle and refracted at a third angle to propagate in a path adjacent to the second side, and the first angle is smaller than the third angle.

2. The light emission module of claim 1, wherein the third side is inclined with respect to the first side and the second side.

3. The light emission module of claim 2, wherein the second orientation angle edge light is incident on the third side and refracted to propagate in a path adjacent to the first side.

4. The light emission module of claim 3, wherein an angle between the first orientation angle edge light and the second orientation angle edge light is an orientation angle of the second light source.

5. The light emission module of claim 4, wherein the second angle equals half of the orientation angle, and when the first angle is α and the orientation angle is β, the following equation is satisfied:

$$\alpha < \sin^{-1}\left[\sin\left(\frac{\beta}{2}\right) \times \left(\frac{n1}{n2}\right)\right]$$

where n1 denotes a refractive index of an air layer between the second light source and the light guide and n2 is a refractive index of the light guide.

6. A display device comprising:

a display panel displaying an image; and a light emission module supplying light to the display panel, wherein the light emission module comprises:

a light guide including a pair of emission sides that are disposed facing each other, a first side connecting each of the pair of emission sides and extending in a first direction, a second side connecting each of the pair of emission sides and extending in a second direction that is different from the first direction, and a third side that connects the first side and the second side; and a light source unit provided at one side of the light guide and distanced from the light guide, wherein the light source unit comprises a first light source that corresponds to the first side, a second light source that corresponds to the third side, and a light source substrate that supports the first light source and the second light source, the light source substrate comprises a first portion that supports the first light source and a second portion that supports the second light source, the second portion is inclined at a first angle with respect to the first portion, the second light source is configured to emit a light incident on the third side, the light comprising a first orientation angle edge light and a second orientation angle edge light, the first orientation angle edge light inclined at a second angle and refracted at a third angle to propagate in a path adjacent to the second side, and the first angle is smaller than the third angle.

7. The display device of claim 6, wherein the third side is inclined with respect to the first side and the second side.

8. The display device of claim 7, wherein the second orientation angle edge light is incident on the third side and refracted to propagate in a path adjacent to the first side.

9. The display device of claim 8, wherein an angle between the first orientation angle edge light and the second orientation angle edge light is an orientation angle of the second light source.

10. The display device of claim 9, wherein the second angle equals half of the orientation angle, and when the first angle is α and the orientation angle is β, the following equation is satisfied:

$$\alpha < \sin^{-1}\left[\sin\left(\frac{\beta}{2}\right) \times \left(\frac{n1}{n2}\right)\right]$$

where n1 denotes a refractive index of an air layer between the second light source and the light guide and n2 is a refractive index of the light guide.

11. The display device of claim 10, wherein the display panel comprises a display area where an image is displayed and a peripheral area that surrounds the display area, the display panel and the display area each include a pair of first sides extending in the first direction, a pair of second sides extending in the second direction, and connection portions connecting the first sides and the second sides that neighbor each other, and each of the connection portions is rounded.

12. The display device of claim 10, wherein the display panel comprises a display area where an image is displayed and a peripheral area that surrounds the display area, the display panel and the display area each include a pair of first sides extending in the first direction, a pair of second sides extending in the second direction, and connection portions connecting the first sides and the second sides that neighbor each other, and each of the connection portions are inclined with respect to the first sides and the second sides that neighbor each other.

* * * * *